United States Patent
Keller et al.

(10) Patent No.: US 7,032,206 B2
(45) Date of Patent: Apr. 18, 2006

(54) SYSTEM AND METHOD FOR ITERATIVELY TRAVERSING A HIERARCHICAL CIRCUIT DESIGN

(75) Inventors: S. Brandon Keller, Evans, CO (US); Gregory Dennis Rogers, Fort Collins, CO (US); George Harold Robbert, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 228 days.

(21) Appl. No.: 10/647,688

(22) Filed: Aug. 25, 2003

(65) Prior Publication Data

US 2005/0050487 A1  Mar. 3, 2005

(51) Int. Cl.
*G06F 17/50* (2006.01)

(52) U.S. Cl. .................................................. 716/12
(58) Field of Classification Search ............... 716/12
See application file for complete search history.

(56) References Cited

U.S. PATENT DOCUMENTS

| | | | |
|---|---|---|---|
| 5,249,133 A | 9/1993 | Batra | |
| 5,301,318 A * | 4/1994 | Mittal | 716/11 |
| 5,668,732 A | 9/1997 | Khouja et al. | |
| 5,673,420 A | 9/1997 | Reyes et al. | |
| 5,682,320 A | 10/1997 | Khouja et al. | |
| 5,696,694 A | 12/1997 | Khouja et al. | |
| 5,790,416 A * | 8/1998 | Norton et al. | 716/11 |
| 5,805,860 A * | 9/1998 | Parham | 716/12 |
| 5,831,869 A | 11/1998 | Ellis et al. | |
| 5,838,579 A | 11/1998 | Olson et al. | |
| 5,903,476 A | 5/1999 | Mauskar et al. | |
| 5,946,218 A | 8/1999 | Taylor et al. | |
| 5,949,691 A | 9/1999 | Kurosaka et al. | |
| 6,028,991 A | 2/2000 | Akashi | |
| 6,075,932 A | 6/2000 | Khouja et al. | |
| 6,185,722 B1 | 2/2001 | Darden et al. | |
| 6,230,299 B1 | 5/2001 | McSherry et al. | |
| 6,272,671 B1 | 8/2001 | Fakhry | |
| 6,308,301 B1 | 10/2001 | McBride et al. | |
| 6,308,304 B1 | 10/2001 | Devgan et al. | |
| 6,330,703 B1 | 12/2001 | Saito et al. | |
| 6,345,379 B1 | 2/2002 | Khouja et al. | |
| 6,363,516 B1 | 3/2002 | Cano et al. | |

(Continued)

FOREIGN PATENT DOCUMENTS

EP        0582918 A2    2/1994

(Continued)

OTHER PUBLICATIONS

Keller, S. Brandon; Rogers, Dennis R.; Lelm, Charles A.; U.S. Appl. No. 10/706,682, Entitled: Method And Program Product For Determining Nets Requiring Detailed Electromigration And Self Heating Analysis In A Digital Integrated Circuit; Filed Nov. 12, 2003.

(Continued)

*Primary Examiner*—Stacy A. Whitmore

(57) ABSTRACT

Systems, methods, and software products iteratively traverse a hierarchical circuit design. An initial net and an instance history that uniquely defines the initial net within the design are selected. The initial net and the instance history are appended to a list of nets to be processed. The initial net and the instance history are inserted into a set of visited nets. Each additional net connected to the initial net is visited in response to a first request from a user. The initial net and each additional net are returned in response to a second request from the user.

20 Claims, 5 Drawing Sheets

U.S. PATENT DOCUMENTS

| | | | |
|---|---|---|---|
| 6,378,123 B1* | 4/2002 | Dupenloup | 716/18 |
| 6,463,571 B1* | 10/2002 | Morgan | 716/5 |
| 6,480,987 B1 | 11/2002 | McBride | |
| 6,490,717 B1 | 12/2002 | Pedersen et al. | |
| 6,493,864 B1 | 12/2002 | Liu | |
| 6,523,149 B1 | 2/2003 | Mehrotra et al. | |
| 6,529,861 B1 | 3/2003 | Patra et al. | |
| 6,531,923 B1 | 3/2003 | Burns | |
| 6,587,999 B1 | 7/2003 | Chen et al. | |
| 6,598,211 B1 | 7/2003 | Zachariah et al. | |
| 6,687,893 B1* | 2/2004 | Teig et al. | 716/14 |
| 6,751,782 B1 | 6/2004 | Levin et al. | |
| 6,772,404 B1 | 8/2004 | Tanaka | |
| 6,801,884 B1 | 10/2004 | Ferreri et al. | |
| 6,807,520 B1 | 10/2004 | Zhou et al. | |
| 6,836,877 B1* | 12/2004 | Dupenloup | 716/18 |
| 6,842,888 B1* | 1/2005 | Roberts | 716/18 |
| 6,854,093 B1* | 2/2005 | Dahl et al. | 716/2 |
| 6,877,146 B1* | 4/2005 | Teig et al. | 716/12 |
| 6,886,140 B1* | 4/2005 | Regnier | 716/1 |
| 6,931,613 B1 | 8/2005 | Kauth et al. | |
| 2002/0002701 A1 | 1/2002 | Usami et al. | |
| 2002/0010901 A1 | 1/2002 | Otaguro | |
| 2002/0023255 A1 | 2/2002 | Kamiewicz | |
| 2002/0112221 A1* | 8/2002 | Ferreri et al. | 716/17 |
| 2002/0144219 A1 | 10/2002 | Zachariah et al. | |
| 2003/0051222 A1 | 3/2003 | Williams et al. | |
| 2003/0074644 A1* | 4/2003 | Mandell et al. | 716/7 |
| 2003/0200519 A1 | 10/2003 | Argyres | |
| 2003/0200522 A1* | 10/2003 | Roberts | 716/18 |
| 2003/0208721 A1* | 11/2003 | Regnier | 716/1 |
| 2003/0221173 A1* | 11/2003 | Fisher | 716/5 |
| 2003/0237067 A1 | 12/2003 | Mielke et al. | |
| 2004/0044972 A1* | 3/2004 | Rohrbaugh et al. | 716/2 |
| 2004/0078767 A1 | 4/2004 | Burks et al. | |
| 2004/0199880 A1 | 10/2004 | Kresh et al. | |

FOREIGN PATENT DOCUMENTS

| | | |
|---|---|---|
| JP | 07334532 A | 12/1995 |

OTHER PUBLICATIONS

Keller, S. Brandon; Rogers, Dennis R.; Lelm, Charles A.; U.S. Appl. No. 10/706,698, Entitled: Method And Program Product For Performing Self-Heating Analysis In A Digital Integrated Circuit Through A Single Cycle Transient Simulation; Filed Nov. 12, 2003.

Keller, S. Brandon; Rogers, Dennis R.; Lelm, Charles A.; U.S. Appl. No. 10/706,376, Entitled: Method And Program For Visual Display and One-Click Repair Of Electromigration And Self Heating Design-Rule Violations In A Digital Integrated Circuit Layout Database; Filed Nov. 12, 2003.

Keller, S. Brandon; Rogers, Dennis R.; Lelm, Charles A.; U.S. Appl. No. 10/706,501, Entitled: Method And Program Product For Perfoming Electromigration Analysis In A Digital Integrated Circuit By Converting A Netlist To A DC Model And Performing DC Analysis Of The DC Model; Filed Nov. 12, 2003.

Keller, S. Brandon; Rogers, Dennis R.; Lelm, Charles A.; U.S. Appl. No. 10/706,526, Entitled: Method And Program Product For Performing A Worst Case Electromigration And Self Heating Analysis In A Digital Integrated Circuit With Worst-Case Superposition Of Partial Currents; Filed Nov. 12, 2003.

Keller, S. Brandon; Rogers, Dennis R.; Lelm, Charles A.; U.S. Appl. No. 10/706,692, Entitled: Method And Program Product For Performing Electromigration Analysis In A Digital Integrated Circuit Through A Single Cycle Transient Simulation; Filed Nov. 12, 2003.

Keller, S. Brandon; Rogers, Dennis R.; Lelm, Charles A.; U.S. Appl. No. 10/706,508, Entitled: Method And Program Product For Performing Self-Heating Analysis In A Digital Integrated Circuit Layout Database by Substituting Resistive Models For Active Devices; Filed Nov. 12, 2003.

Keller, S. Brandon; Rogers, Dennis R.; Robberts, George H.; U.S. Appl. No. 10769,675 filed under EV210655516US; Entitled: Method And Program Product For Determining Worst Case Currents In A Digital Integrated Circuit Through Worst-Case Superposition Of Partial Currents; Filed Jan. 30, 2004.

Keller, S. Brandon; Rogers, Dennis R.; Robberts, George H.; U.S. Appl. No. 10/769,702 filed under EV210655564US; Entitled: Systems And Methods For Re-Using Circuit Design Analysis Results; Filed Jan. 30, 2004.

Keller, S. Brandon; Rogers, Dennis R.; Robberts, George H.; U.S. Appl. No. 10/769,687 filed under EV210655581US; Entitled: System And Method For Determining Detail Of Analysis In A Circuit Design; Filed Jan. 30, 2004.

Keller, S. Brandon; Rogers, Dennis R.; Robberts, George H.; U.S. Appl. No. 10/769,495 filed uner EV210655595US; Entitled: Systems And Methods That Identify Equivalent Instantiation-Specific Configuration Information For Analysis Tools; Filed Jan. 30, 2004.

Keller, S. Brandon; Rogers, Dennis R.; Robberts, George H. & Stevens, Scott Alan; U.S. Appl. No. 10/769,682 filed under EV210655520US; Entitled: System And Method To Limit Analyzed Current Flow In A Circuit Design; Filed Jan. 30, 2004.

Keller, S. Brandon; Rogers, Dennis R.; Robberts, George H.; U.S. Appl. No. 10/768,442 filed under EV210655533US; Entitled: System And Method For Processing Configuration Information; Filed Jan. 30, 2004.

Keller, S. Brandon; Rogers, Dennis R.; Robberts, George H.; U.S. Appl. No. 10/769,683, filed under EV210655555US; Entitled: System And Method For Balancing Run-Time And Result Accuracy In A Circuit Design Analysis Tool; Filed Jan. 30, 2004.

Keller, S. Brandon; Rogers, Dennis R.; Robberts, George H.; U.S. Appl. No. 10/769,676 filed under EV210655578US; Entitled: System And Method For Indicating Logic State Combinations Used During Circuit Design Analysis; Filed Jan. 30, 2004.

Keller, S. Brandon; Rogers, Dennis R.; Robberts, George H.; U.S. Appl. No. 10/769,673 filed under EV210655547US; Entitled: System And Method For Determining Control Signal Combinations For Use During Simulation Of A Stage Of A Circuit Design; Filed Jan. 30, 2004.

* cited by examiner

SYSTEM AND METHOD FOR ITERATIVELY TRAVERSING A HIERARCHICAL CIRCUIT DESIGN

RELATED APPLICATIONS

The present document contains material related to the material of copending, cofiled, U.S. patent application Ser. No. 10/647,597, entitled System And Method For Determining Wire Capacitance For A VLSI Circuit; U.S. patent application Ser. No. 10/647,595, entitled System And Method For Determining Applicable Configuration Information For Use In Analysis Of A Computer Aided Design; U.S. patent application Ser. No. 10/647,687, entitled Systems And Methods Utilizing Fast Analysis Information During Detailed Analysis Of A Circuit Design; U.S. patent application Ser. No. 10/647,594, entitled Systems And Methods For Determining Activity Factors Of A Circuit Design; U.S. patent application Ser. No. 10/647,768, entitled System And Method For Determining A Highest Level Signal Name In A Hierarchical VLSI Design; U.S. patent application Ser. No. 10/647,606, entitled System And Method For Determining Connectivity Of Nets In A Hierarchical Circuit Design; U.S. patent application Ser. No. 10/647,596, entitled System And Method Analyzing Design Elements In Computer Aided Design Tools; U.S. patent application Ser. No. 10/647,608, entitled System And Method For Determining Unmatched Design Elements In A Computer-Automated Design; U.S. patent application Ser. No. 10/647,598, entitled Computer Aided Design Systems And Methods With Reduced Memory Utilization; U.S. patent application Ser. No. 10/647,769, entitled Systems And Methods For Establishing Data Model Consistency Of Computer Aided Design Tools; U.S. patent application Ser. No. 10/647,607, entitled Systems And Methods For Identifying Data Sources Associated With A Circuit Design; and U.S. patent application Ser. No. 10/647,605, entitled Systems And Methods For Performing Circuit Analysis On A Circuit Design, the disclosures of which are hereby incorporated herein by reference.

BACKGROUND

An electronic computer aided design ("E-CAD") tool is used to create and analyze a circuit design, including a very large scale integration ("VLSI") circuit design. The circuit design includes a netlist that identifies electronic design elements (e.g., capacitors, transistors, resistors, etc.) and their interconnectivity (e.g., nets) within the circuit design.

A signal net is a single electrical path in a circuit design that has the same electrical characteristics at all of its points. Any collection of wires that carries the same signal between design elements is a signal net. If the design elements allow the signal to pass through unaltered (as in the case of a terminal), then the signal net continues on subsequently connected wires. If, however, the design element modifies the signal (as in the case of a transistor or logic gate), then the signal net terminates at that design element and a signal new net begins on the other side.

A significant characteristic of VLSI and other types of circuit design is a reliance on hierarchical description. A primary reason for using hierarchical description is to hide the vast amount of detail in a circuit design. By reducing the distracting detail to a single object that is lower in the hierarchy, one can greatly simplify many E-CAD operations. For example, simulation, verification, design-rule checking, and layout constraints can all benefit from hierarchical representation, which makes them more computationally tractable. Since many circuit designs are too complicated to be easily considered in their totality, a complete design is often viewed as a collection of design element aggregates that are further divided into sub-aggregates in a recursive and hierarchical manner. In VLSI circuit design, these aggregates are commonly referred to as design blocks (or cells). The use of a design block at a given level of hierarchy is called an 'instance'. Each design block has one or more 'ports', each of which provides a connection point between a signal net within the design block and a signal net external to the design block. A net within one design block may thereby connect with a net in another design block, the net 'pieces' forming a single net known as a 'highest level signal name' ("HLSN"). The HLSN is identified by the name of the net 'piece' located at the highest hierarchical level in the circuit design.

When tracing signal paths through a hierarchical circuit design, it is often desirable to know the HLSN of a given net, other than the one being traced. This situation can occur, for example, when a terminal of a device is reached at some level of the hierarchical design, and the HLSN of one or more other terminals for that device needs to be determined. Presently known tracing strategies typically use recursive methods that employ complex algorithms that redundantly analyze a circuit design, and which are conceptually non-intuitive to developers of E-CAD tools.

Tracing a hierarchical circuit design can be a tedious process to implement. The following pseudo-code illustrates one manner in which the trace has typically heretofore been performed. Initially, an initial net is selected. Then, a routine (such as 'RECURSE', below) is employed to recursively traverse the hierarchical design for each port and port instance on the net.

```
RECURSE:
DoSomeStuff (net)
foreach portinst on net {
    get instance owner of portinst
    get describer of instance
    get port describer of portinst
    push instance onto instance_hist
    get net on port
    RECURSE(net, instance_hist)
}
foreach port on net {
    get instance from instance_hist
    get portinst instantiation of port
    pop instance off instance_hist
    get net on portinst
    RECURSE(net, instance_hist)
}
END RECURSE
```

The above recursive routine is executionally redundant, and therefore not particularly efficient, and can thus require a great deal of processor time to traverse a typical VLSI circuit design, particularly when an analysis tool needs to iterate over nets in the design to determine properties or quantities unrelated to the circuit hierarchy. The problem of traversals can become even more complicated when the capability of skipping 'around' elements in the design is desired. For instance, if a field-effect transistor ("FET") is encountered in tracing through a circuit design, it may be necessary to skip to the opposite side of the FET (e.g., source to drain, or drain to source) and continue tracing.

SUMMARY

In one embodiment, a method iteratively traverses a hierarchical circuit design. An initial net, and an instance history that uniquely defines the initial net within the circuit design are selected. The initial net and the instance history are appended to a list of nets to be processed. The initial net and the instance history are inserted into a set of visited nets. Each additional net connected to the initial net is visited in response to a first request from a user. The initial net and each additional net are returned in response to a second request from the user.

In another embodiment, a system iteratively traverses a hierarchical circuit design, including: means for selecting an initial net and an instance history that uniquely defines the initial net within the design; means for appending, to a list of nets to be processed, the initial net and the instance history; means for inserting, into a set of visited nets, the initial net and the instance history; and means for visiting, in response to a first request from a user, each additional net connected to the initial net.

In another embodiment, a system iteratively traverses a hierarchical circuit design. The system includes an iterator function, an incomplete trace object, and a processor. The iterator function selects an initial net and an instance history that uniquely defines the initial net within the circuit design. The iterator function appends the initial net and the instance history to a list of nets to be processed. The iterator function inserts the initial net and the instance history into a set of visited nets. The incomplete trace object visits each additional net connected to the initial net in response to a first request from a user. The incomplete trace object returns the initial net and each additional net in response to a second request from the user. The processor executes the iterator function and invokes the incomplete trace object.

In another embodiment, a software product comprises of instructions, stored on computer-readable media, wherein the instructions, when executed by a computer, iteratively traverses a hierarchical circuit design, comprising: instructions for selecting an initial net and an instance history that uniquely defines the initial net within the design; instructions for appending, to a list of nets to be processed, the initial net and the instance history; instructions for inserting, into a set of visited nets, the initial net and the instance history; instructions for visiting, on a first request from a user, each additional net connected to the initial net; and instructions for returning, on a second request from the user, the initial net and each additional net.

DETAILED DESCRIPTION

Figure 1:
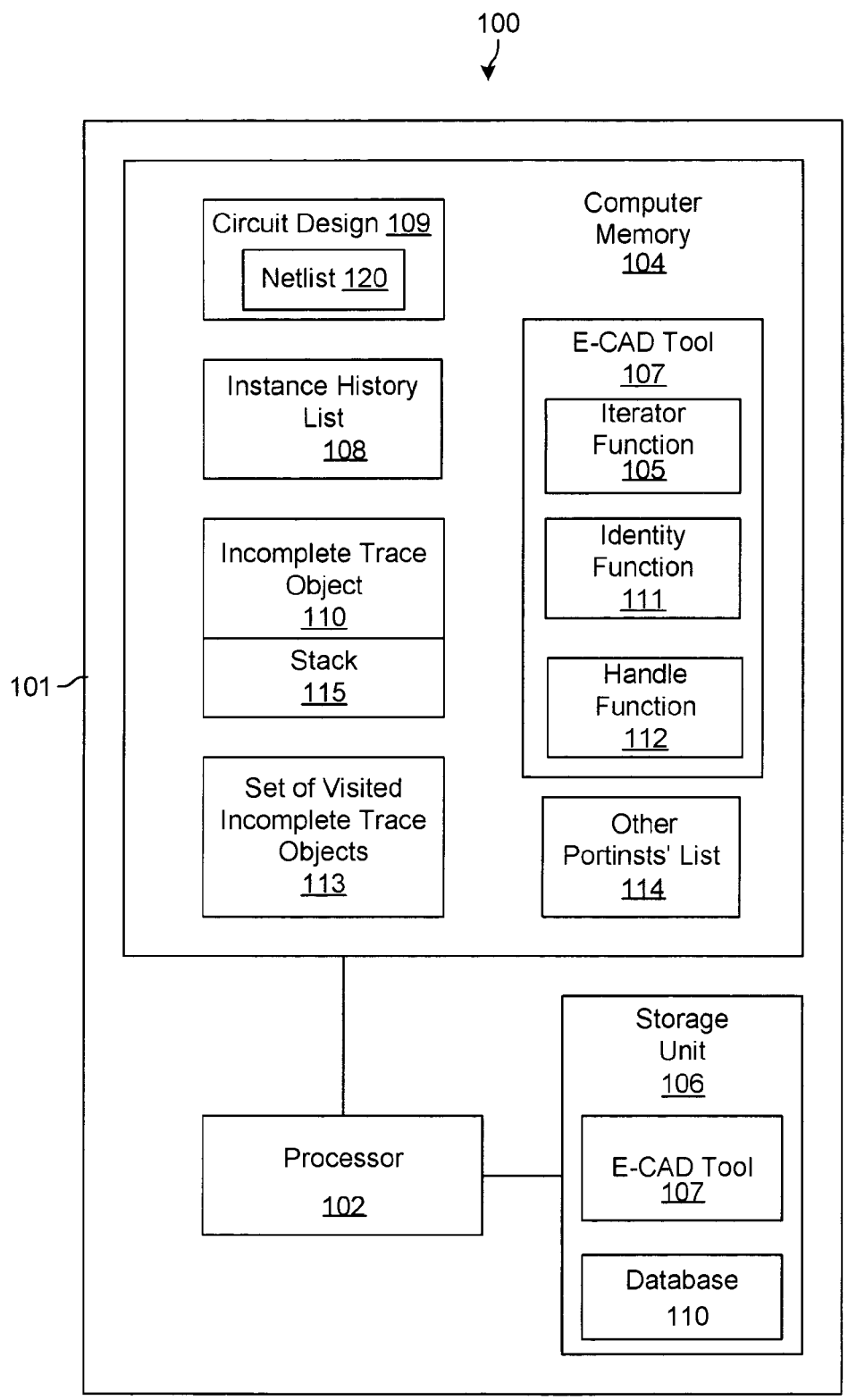
FIG. 1 shows one system for iteratively traversing a hierarchical circuit design.

FIG. 1 shows an exemplary electronic computer aided design ("E-CAD") system 100 configured for iteratively traversing a hierarchical circuit design 109. In one example, system 100 traverses design elements and/or nets of circuit design 109. System 100 includes computer system 101 and E-CAD tool 107. Computer system 101 controls E-CAD tool 107 to analyze circuit design 109, which includes a hierarchical VLSI design description, typically including a netlist 120 defining design elements and nets associated with circuit design 109. Computer system 101 includes processor 102, computer memory 104, and storage unit 106. Processor 102 is coupled to computer memory 104 and to storage unit 106. In one embodiment, E-CAD tool 107 initially resides in storage unit 106. Upon initialization, E-CAD tool 107 and at least a part of design 109 are loaded into computer memory 104. Processor 102 then executes E-CAD tool 107 to perform the functions described herein.

Figure 4:
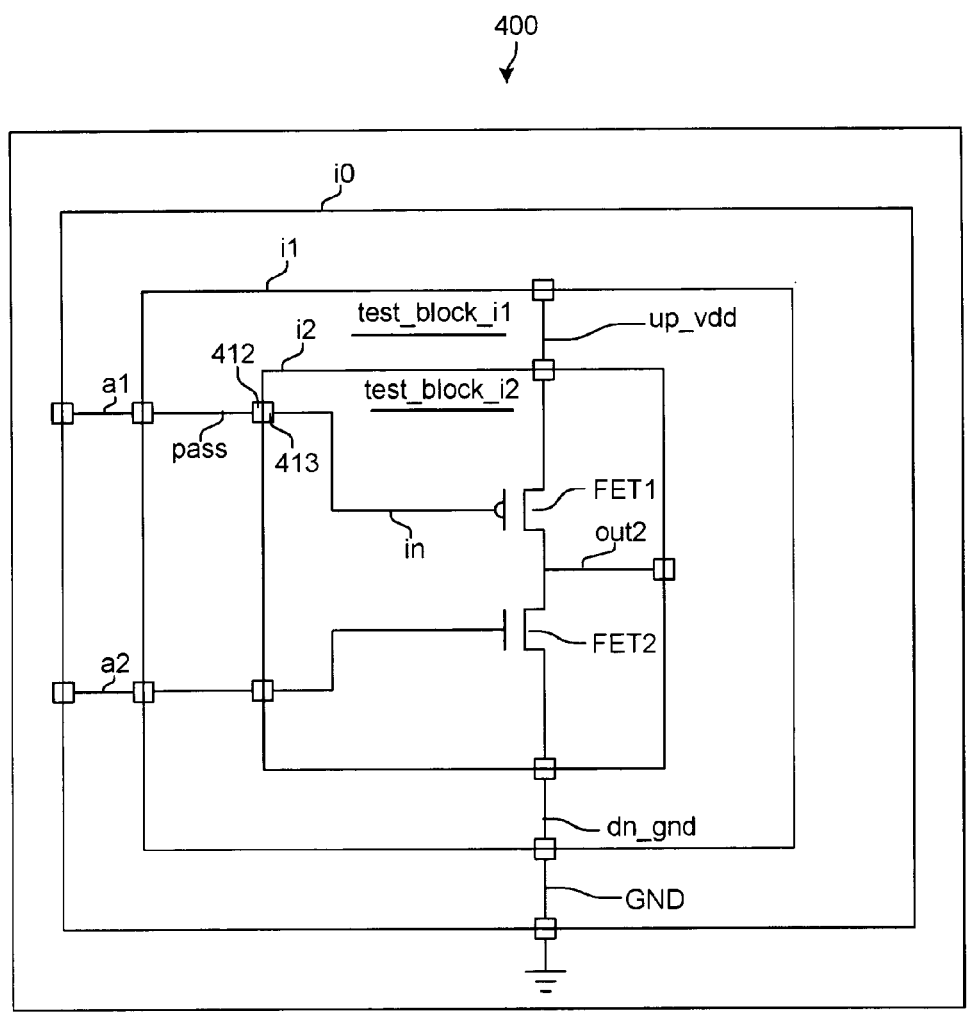
FIG. 4 is a diagram of an exemplary hierarchical design that may be traversed using the present method.

Circuit design 109 may be viewed as a collection of components that are further divided in a hierarchical manner into sub-components commonly referred to as blocks or cells. The use of a block at a given level of hierarchy is called an 'instance'. Each block in design 109 has one or more 'ports', each of which provides a connection point between a net within the block and a net external to the block. The terms 'block', 'instance', 'port', and 'port instance' may be explained as follows, using exemplary circuit design 400 in FIG. 4 as a reference. As shown in FIG. 4, circuit design 400 includes block instances i0, i1, and i2. Instances i0 and i1 are hierarchically connected by nets 'a1', 'a2', and GND. Instances i1 and i2 are hierarchically connected by nets 'pass', 'up_vdd', and 'dn_gnd'. Instance i1, when viewed from the perspective of a top level in the sub-hierarchy represented by test_block_i1 and test_block_i2, is itself considered to be a block, i.e., test_block_i1, in that particular hierarchical context. In the same context, the block test_block_i1 contains instance i2, which, if considered from a perspective internal to the 'box' (i2/test_block_i2) shown in FIG. 4, would be referred to as block test_block_i2.

It can thus be seen that the definitions of 'block' and block 'instance' respectively depend on whether a particular 'box' (a block or instance of the block) is viewed from an internal or external standpoint, i.e., the appropriate nomenclature depends on the hierarchical perspective from which the 'box' is viewed. Each 'box' (block or instance) has a plurality of 'ports' and corresponding port instances ('port-insts'), each pair of which provides a connection point between a net within the block and a net external to the block. A 'port/portinst' thus comprises two contiguous parts, a first part, termed a 'portinst', which is a port instance located externally on a box (or instance) boundary; and a second part, termed a 'port', which is located internally on the box (or block) boundary.

As can be seen from FIG. 4, portinsts are the half of the 'port/portinst' on the outside of a 'box' (for example, item 412), and ports are the half of the 'port/portinst' on the inside of a 'box' (e.g., item 413). A port takes the same name as the net to which it is connected, and port instances have the same name as their describing port (i.e., the same name as the net in the describing block). When examining netlist 120 that is part of design 109, portinst 412 in design 400 may be described in netlist 120 as 'net pass-> port inst in' in the block test_block_i1. This netlist entry indicates that the net 'pass' connects to the portinst 'in' 412 on instance 'i2.' The corresponding port in test_block_i2 is port 413, which has the name 'in', since it is connected to net 'in' in test_block_i2. In an exemplary embodiment, a hierarchical model stored as part of design 109 is used to represent the hierarchy of design 400, and the difference between a portinst and a port is readily determined through the use of object-oriented techniques in which port and portinst are different objects that are owned by different types of objects.

With further regard to FIG. 1, system 100 provides a mechanism for iteratively traversing a path through nets in a hierarchical design, without redundantly returning or identifying nets encountered in the trace process. System 100 also provides the capability of skipping 'around' instances in a hierarchical design 109 when tracing through circuit design 109. A node is a connectivity point within the netlist (e.g., the FET source is connected to a first node, and the FET drain is connected to a second node). For example, if a FET is encountered in tracing through design 109, it may be desirable or necessary to skip to the opposite side (node) of the FET (source to drain, or drain to source) and continue tracing. The present system 100 may therefore include an 'identity' function 111 that causes system 100 to traverse around blocks indicated by the user, to avoid entering certain blocks. This allows tracing across transistor channel connections, for example, which allows specifying the specific portinsts to be traced out of. A hierarchical net iterator ('HierNetIter') function 105 may invoke additional functions 'IdentFunc' and 'HandleFunc', as described below:

HierNetIter(net, instance_hist, IdentFunc, HandleFunc)

In one example, as E-CAD tool 107 initially traverses a signal from net to net through associated ports and port instances, a pointer to an object that represents the currently encountered instance is pushed onto a stack or list (an 'instance history list') 108, containing instances of blocks (hereinafter simply 'instances') that have been traced 'into'. Instance history list 108 is then used to retrace the path back up to higher levels of the hierarchy. The instance history in list 108 ('instance_hist') is used to uniquely identify the starting net that was reached in the trace process. The present system 100 may also utilize user-defined 'callback' functions to handle special cases encountered during traversal of circuit design 109. For example, identity function ('IdentFunc') 111 may be used to provide an indication of which instances to skip across (trace around), and a handle function ('HandleFunc') 112 may be used to identify which portinsts (with associated nets) on identified instances should be added to the list of connected nets (e.g., non-driver or receiver FETs may be crossed to the other channel connected node, and tracing may be stopped at any driver or receiver terminal).

Functions 105, 111, 112 may provide certain flexibility in traversal of circuit design 109. For example, assume that E-CAD tool 107 starts at a driver output (e.g., net 'out2' in instance i2 in the example shown in FIG. 4), and traces to all connected nets while crossing any channel connected FETs (e.g., FET1 and FET2). Assume, also, that this traversal should terminate when encountering the gate connection of each FET, and not trace around it. Hierarchical net iterator function 105 allows this type of circuit traversal to be performed, for example in the following manner:

Iterator Routine Example

```
HierNetIter hni(out2, instance_hist_to_out2,
    IsTransistor,
    StopAtDriverOrReceiver);
```

-continued

```
for (hni.Begin( ); !hni.End( ); hni++) {
    local_net = *hni;
    PerformOperation(local_net);
}
```

As the 'for' loop shown above in the Iterator Routine Example is iterated, net iterator function 105 visits each unique hierarchical net in the circuit design to which it is applied, starting with net 'out2' in this particular example. Since a hierarchical net is unique relative to a specific selected net, as well as its associated instance history in a given trace, the iterator function 105 returns both of these entities.

Hierarchical Net Iterator Function 105

In one embodiment, the hierarchical net iterator functionality utilizes 'incomplete traces', which are represented by objects ('incomplete trace objects' 110) that represent a particular (unique) net in a hierarchical design, and which maintain information about what other connections on this net need to be traced. In an exemplary embodiment, hierarchical net iterator 105 performs the operations shown in the flowchart of FIG. 2, in the following manner:

At step 201, prior to initialization of net iterator function 105, a signal is traced from a starting net in design 109 to a terminal net in the design. As this initial trace is performed, the signal is traced from net to net through associated ports and port instances, and a pointer to an object that represents the instance of interest is pushed onto a stack or list ('instance history list') 108, containing instances that have been traced 'into'. Instance history list 108 is then used to retrace the path back up to higher levels of the design hierarchy.

At step 205, net iterator function 105 is initialized with an initial net and an instance history that uniquely defines the path traversed through design 109 to reach the initial net. In the example 'HierNetIter' function call shown below, the parameters provided to net iterator function 105 are:

'instance_hist_to_out2'—the trace history of the initial trace up to net 'out2', stored in instance history list 108;

'IsTransistor'—the identity function 111 parameter indicating that each instance of a transistor (e.g., a PFET or NFET) is to be traced around; and 'StopAtDriverOrReceiver'—the handle function 112 parameter indicating that the trace should cross to the other node for channel connected non-driver or receiver transistors, and stop tracing at any driver or receiver terminal.

HierNetIter hni(out2, instance_hist_to_out2, IsTransistor, StopAtDriverOrReceiver)

In step 210, net iterator function 105 then creates an incomplete trace object 110 with the specified net and instance history, and initializes the portinst and port iterators (described with respect to FIG. 3, below) within the object. This first incomplete trace object 110 is placed on top of an 'incomplete trace' stack 115 in computer memory 104, at step 215. At step 217, the incomplete trace object 110 thus created is inserted in a set of visited incomplete trace objects 113.

At step 220, each time a user requests the net that net iterator function 105 is presently 'pointing' to, iterator function 105 is dereferenced (step 225), and returns a structure containing the net and instance history that are within the incomplete trace object 110 currently on the top of the incomplete trace stack 115, at step 230.

At step 240, each time a user requests the next net relative to the current incomplete trace object 110, iterator function 105 is incremented, at step 245, and the next incomplete trace object 110 on the top of the stack 115 is requested, at step 250, to provide the next unique net that can be reached from the net within the incomplete trace object 110. Thus, when iterator function 105 is incremented, it receives the next connected net from incomplete trace object 110, given its current state.

Figure 3:
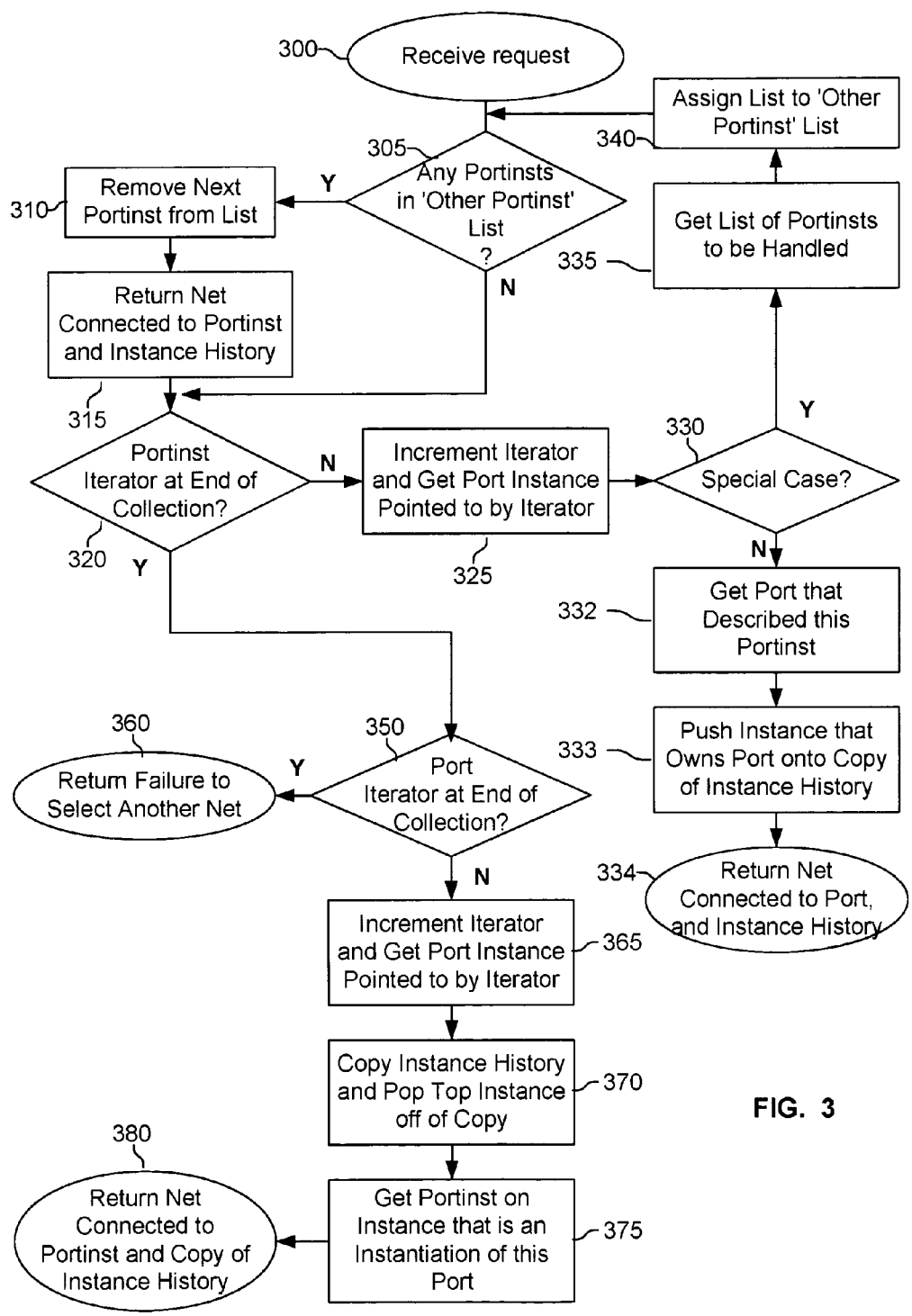
FIG. 3 is a flowchart illustrating an exemplary set of steps performed to facilitate the operation shown FIG. 2.

At step 255, if the top incomplete trace object 110 returns unsuccessfully, i.e., if the incomplete trace object has reached the end of all of its lists (other port insts, port insts, and ports, as indicated in FIG. 3), there is nothing more that can be traced within that incomplete trace object, so it is now 'complete' and can be removed from stack 115. Net iterator function 105 removes the top incomplete trace from the incomplete trace stack 115 and deletes it, at step 260. Processing continues with step 265, described below.

If the incomplete trace object returns successfully (at step 255), then at step 257, if the returned incomplete trace has not been visited, i.e., if the current incomplete trace object 110 is not in the set of visited incomplete trace objects 113, it is added to the incomplete trace stack 115, at step 215, at which processing continues; otherwise, the incomplete trace object 110 returns the next unique net in the incomplete trace object, at step 250, described above in connection with FIG. 3.

If, at step 265, the incomplete trace stack 115 is empty, then the net iterator function's task is completed (step 270), and successive calls to increment or dereference iterator function 105 will not change its state. If the incomplete trace stack 115 is not empty, then subsequent 'increments' to Net iterator function 105 enter at the increment entry point 245, and 'dereferences' enter at the dereference entry point 225.

Get_Next_Net Function

The creation of an incomplete trace object 110 involves initializing 'sub-iterators' that check all of the portinsts and ports connected to the given net. The portinst and port iterators (described below) iterate over a collection of items (portinsts or ports). FIG. 3 is one embodiment of block 250 in FIG. 2, in which an incomplete trace object 110 uses an algorithm to determine the next net in the trace process. This algorithm (the 'Get_Next Net' function) is described as follows:

In response to a user request (step 300) to find the next net in a trace operation, a check is made at step 305 to determine whether there are portinsts in the other_port_insts list 114 (see step 340, below). If list 114 is not empty, then at step 310, the next portinst is removed from list 114, and, at step 315, the net connected to the portinst, along with the current instance history list 108, is returned, since the instance history uniquely identifies the current net.

At step 320, if the port inst iterator (represented by blocks 305–340) is at the end of its collection, processing continues with step 350, below. If the port inst iterator is not yet at the end of its collection, then iterator function 105 is incremented at step 325, and the port instance, to which iterator function 105 is pointing, is retrieved.

At step 330, handle function 112 is invoked to check the instance that owns the portinst (the 'owning instance') to see if it is a 'special case'. Special cases are determined and processed by a user-provided callback function to allow the net iterator 105 to handle certain types of instances in a manner defined by the user. For example, a particular user might require a function that skips from one side of a FET to the other. Identity function ('IdentFunc') 111 is an example of a function that handles such a 'special case'. If the present owning instance is a special case, then, at step 335, the list of portinsts to be handled (using handle function 112) is retrieved. The list is then assigned to the other_port_insts list 114 (FIG. 1), at step 340, and the above-described part of the algorithm is repeated, starting with step 305.

If, at step 330, the owning instance is not a special case, then at step 332, the port that describes the current portinst is retrieved. At step 333, the instance that owns the port instance is pushed onto a stack containing a copy of instance history list 108; and, at step 334, the net connected to the port, along with this copy of instance history list, is returned.

At step 350 (when the port inst iterator is at the end of its collection), if the port iterator (represented by blocks 350–380) is not at the end of its collection, then, at step 365, the port iterator is incremented, and the port to which the iterator is pointing is retrieved. At step 370, a copy of instance history list 108 is made, and the top instance is popped off of the copy. At step 375, the portinst on the instance that is an instantiation of the port is retrieved, and the net connected to that portinst, along with the copy of the instance history list 108, is returned at step 380.

At step 350, if the port iterator is at the end of its collection, the other_port_insts list 114 is empty, and thus both the portinst iterator and the port iterator are at the end of their respective collections. Since no further nets are to be found, this 'incomplete' trace is now complete. Thus, at step 360, a 'failure to select another net' indication is returned.

The present net iterator function 105 allows use of other desired design models by using a new definition of incomplete trace object 110. For example, system 100 may employ a model wherein nets are not the primary connection method, but instead has multiple owned connection devices.

It should be noted that either the incomplete trace object or the iterator function may perform the function of retrieving the next net, i.e., the function of performing next-net-retrieval is not limited to inclusion in the incomplete trace object, and this function may be performed in the iterator or elsewhere in a separate function.

Figure 5:
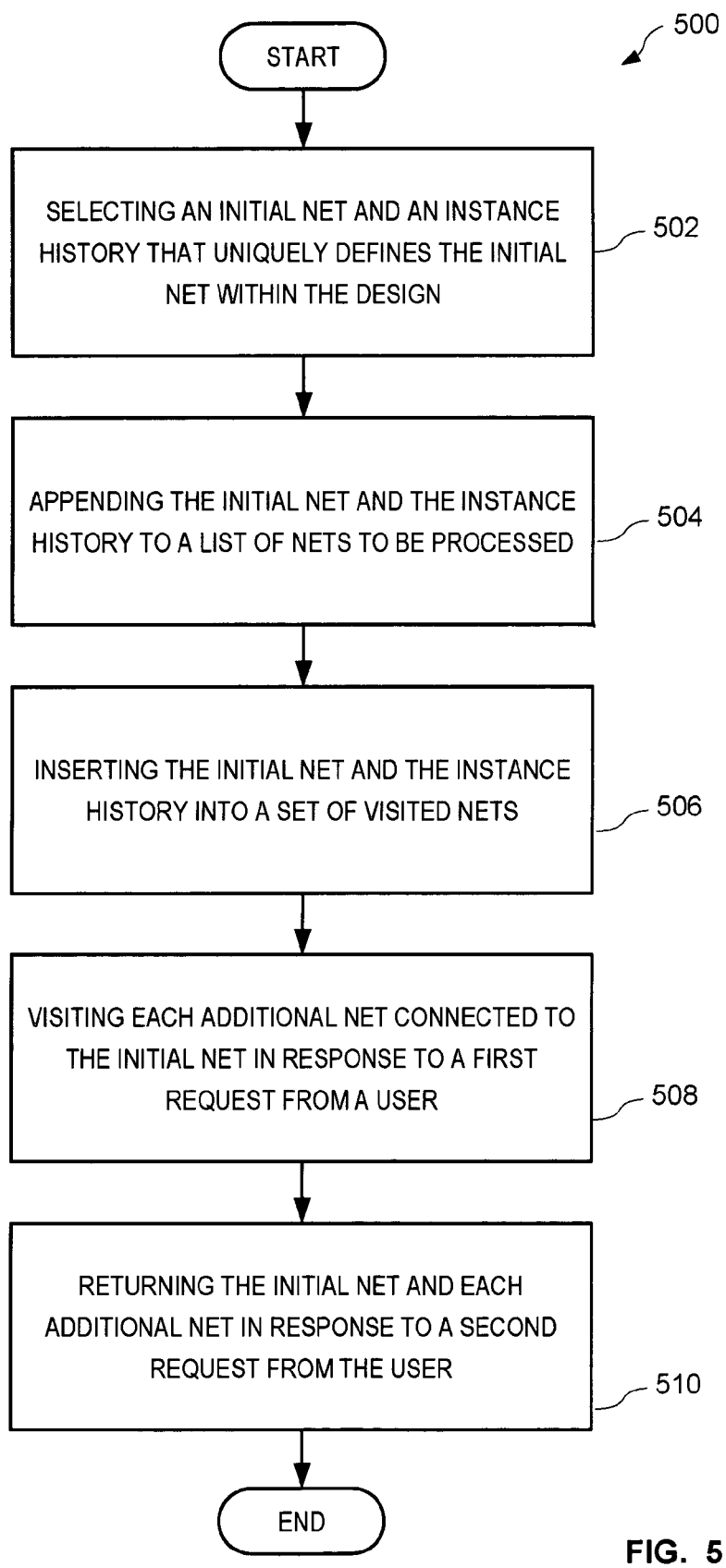
FIG. 5 is a flowchart illustrating one process for iteratively traversing a hierarchical circuit design.

FIG. 5 is a flowchart illustrating one process 500 for hierarchically traversing a circuit design. Process 500 is for example implemented by system 100, FIG. 1. In step 502, process 500 selects an initial net and an instance history that uniquely defines the initial net within the circuit design. In step 504, the initial net and the instance history are appended to a list of nets to be processed. In step 506, the initial net and the instance history are inserted into a set of visited nets. In step 508, each additional net connected to the initial net is visited in response to a first request from a user,. In step 510, the initial net and each additional net are returned in response to a second request from the user.

Figure 2:
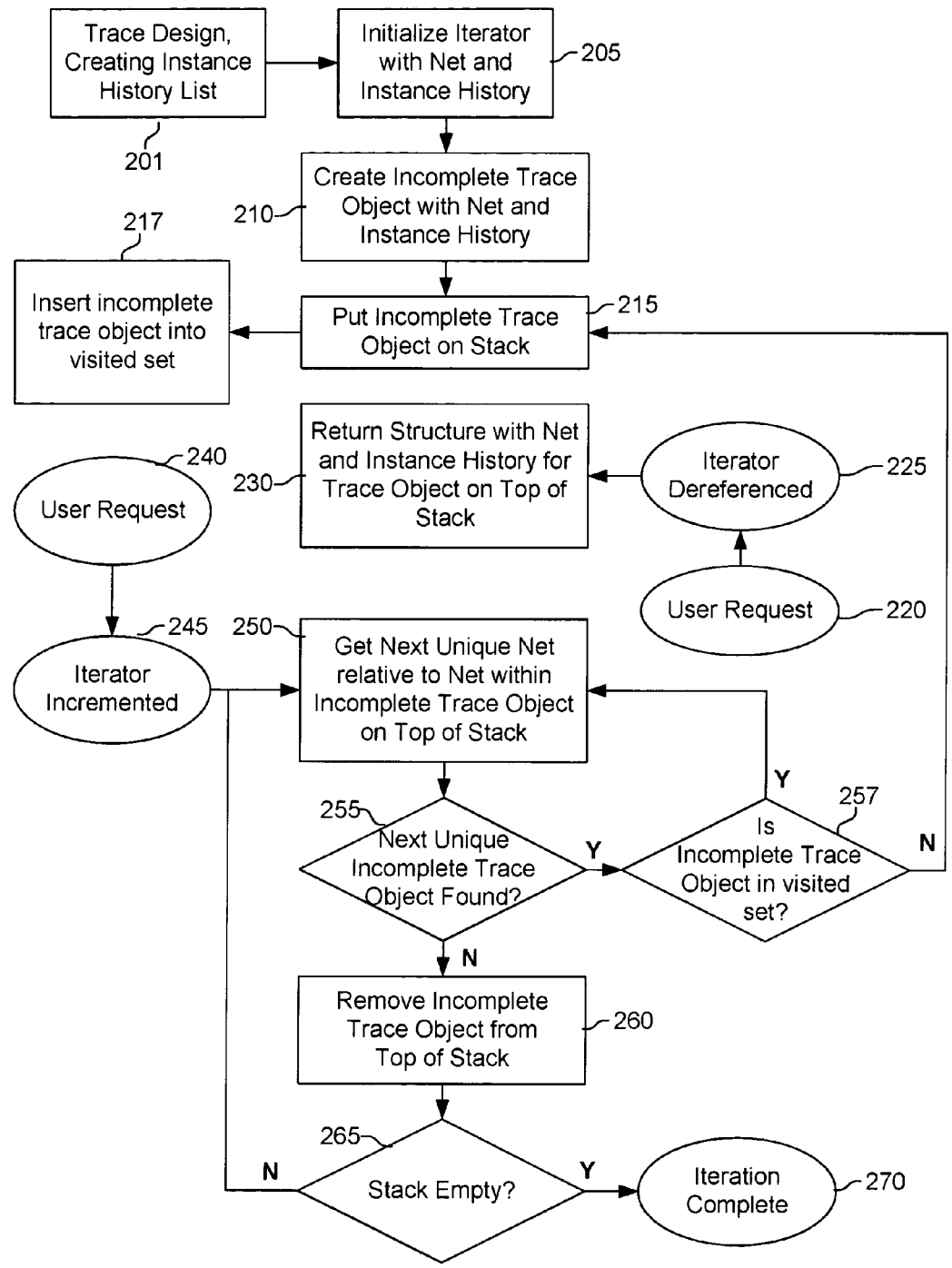
FIG. 2 is a flowchart illustrating an exemplary set of steps performed during operation of the system of FIG. 1.

Instructions that perform the operation discussed with respect to FIGS. 2, 3 and 5 may be stored on computer-readable storage media. These instructions may be retrieved and executed by a processor, such as processor 102 of FIG. 1, to direct the processor to operate in accordance with the present system. The instructions may also be stored in firmware. Examples of storage media include memory devices, tapes, disks, integrated circuits, and servers.

Certain changes may be made in the above methods and systems without departing from the scope of the present system. It is to be noted that all matter contained in the above description or shown in the accompanying drawings is to be interpreted as illustrative and not in a limiting sense. For example, the items shown in FIG. 1 may be constructed, connected, arranged, and/or combined in other configurations, and the set of steps illustrated in FIGS. 2 and 3 may be performed in a different order than shown without departing from the spirit hereof.

What is claimed is:

1. A method for iteratively traversing a hierarchical circuit design, comprising:
   selecting an initial net and an instance history that uniquely defines the initial net within the circuit design;
   appending, to a list of nets to be processed, the initial net and the instance history;
   inserting, into a set of visited incomplete trace objects, the initial net and the instance history;
   visiting, in response to a first request from a user, each additional net connected to the initial net; and
   returning, in response to a second request from the user, the initial net and each additional net.

2. The method of claim 1, the step of visiting comprising:
   determining, for each one of the nets to be processed in the list of nets to be processed, the additional nets that are connected to the net to be processed;
   checking the set of visited incomplete trace objects to determine unvisited additional nets that have not been visited;
   appending, to the list of nets to be processed, each of the unvisited additional nets; and
   inserting, into the set of visited incomplete trace objects, each of the unvisited additional nets.

3. The method of claim 2, wherein the step of determining comprises:
   calling, for each instance in the hierarchical circuit design connected to the net to be processed, a first user-defined callback function to identify instances of interest;
   querying, for each instance of interest, a second user-defined callback function to identify the additional nets; and
   appending, to the list of nets to be processed, the additional nets identified by the second user-defined callback function.

4. The method of claim 3, wherein the first callback function is configured to provide an indication of the instances to be traced around.

5. The method of claim 3, wherein the first callback function is configured to provide an indication of the instances for which tracing should halt.

6. The method of claim 5, wherein the second callback function is configured to resume a trace at one or more nodes when a first node of the instance to be traced around is encountered during the trace, and to terminate the trace if the first node is a specified type of terminal on the instance for which tracing should halt.

7. The method of claim 3, wherein the instances of interest comprise a specified type of transistor.

8. A system for iteratively traversing a hierarchical circuit design, comprising:
   means for selecting an initial net and an instance history that uniquely defines the initial net within the design;
   means for appending, to a list of nets to be processed, the initial net and the instance history;
   means for inserting, into a set of visited incomplete trace objects, the initial net and the instance history; and
   means for visiting, in response to a first request from a user, each additional net connected to the initial net.

9. The system of claim 8, wherein the initial net and each additional net is returned in response to a second request from the user and wherein the means for visiting further comprises:
   means for determining, for each one of the nets to be processed in the list of nets to be processed, the additional nets that are connected to the net to be processed;
   means for checking the set of visited incomplete trace objects to determine unvisited additional nets that have not been visited;
   means for appending, to the list of nets to be processed, each of the unvisited additional nets; and
   means for inserting, into the set of visited incomplete trace objects, each of the unvisited additional nets.

10. The system of claim 9, wherein the means for determining comprises:
    means for calling, for each instance in the design connected to the net to be processed, a first user-defined callback function to identify instances of interest;
    means for querying, for each instance of interest, a second user-defined callback function to identify the additional nets; and
    means for appending, to the list of nets to be processed, the additional nets identified by the second user-defined callback function.

11. The system of claim 10, wherein the first user-defined callback function is configured to allow a user to provide an indication of the instances to be traced around.

12. The system of claim 10, wherein the first user-defined callback function is configured to allow a user to provide an indication of the instances for which tracing should halt.

13. The system of claim 12, wherein the second user-defined callback function is configured to resume a trace at one or more nodes when a first node of the instance to be traced around is encountered during the trace, and to terminate the trace if the first node is a specified type of terminal on the instance for which tracing should halt.

14. A system for iteratively traversing a hierarchical circuit design, comprising:
    an iterator function;
    an incomplete trace object;
    a processor for executing the iterator function and invoking the incomplete trace object, wherein the iterator function:
      selects an initial net and an instance history that uniquely defines the initial net within the circuit design;
      appends, to a list of nets to be processed, the initial net and the instance history;
      inserts, into a set of visited incomplete trace objects, the initial net and the instance history;
    and wherein the incomplete trace object:
      visits, in response to a first request from a user, each additional net connected to the initial net; and
      returns, in response to a second request from the user, the initial net and each additional net.

15. The system of claim 14, wherein each additional net is visited by:
    determining, for each one of the nets to be processed in the list of nets to be processed, the additional nets that are connected to the net to be processed;
    checking the set of visited incomplete trace objects to determine unvisited additional nets that have not been visited;
    appending, to the list of nets to be processed, each of the unvisited additional nets; and inserting, into the set of visited incomplete trace objects, each of the unvisited additional nets.

16. The system of claim 15, including a first user-defined callback function and a second user-defined callback function, wherein:
the first user-defined callback function is called to identify instances of interest for each instance in the circuit design connected to the net to be processed; and
the second user-defined callback function is queried to identify the additional nets for each instance of interest, and to append the additional nets thus identified to the list of nets to be processed.

17. The system of claim 16, wherein the first user-defined callback function is configured to allow a user to provide an indication of the instances to be traced around, or for which tracing should halt.

18. The system of claim 17, wherein the second user-defined callback function is configured to resume a trace at one or more nodes when a first node of the instance to be traced around is encountered during the trace, and to terminate the trace if the first node is a specified type of terminal on the instance for which tracing should halt.

19. A software product comprising instructions, stored on computer-readable media, wherein the instructions, when executed by a computer, iteratively traverse a hierarchical circuit design, comprising:
instructions for selecting an initial net and an instance history that uniquely defines the initial net within the circuit design;
instructions for appending, to a list of nets to be processed, the initial net and the instance history;
instructions for inserting, into a set of visited incomplete trace objects, the initial net and the instance history;
instructions for visiting, on a first request from a user, each additional net connected to the initial net; and
instructions for returning, on a second request from the user, the initial net and each additional net.

20. The software product of claim 19, wherein the instructions for visiting further comprise:
instructions for determining, for each one of the nets to be processed in the list of nets to be processed, the additional nets that are connected to the net to be processed;
instructions for checking the set of visited incomplete trace objects to determine unvisited additional nets that have not been visited;
instructions for appending, to the list of nets to be processed, each of the unvisited additional nets; and
instructions for inserting, into the set of visited incomplete trace objects, each of the unvisited additional nets.

* * * * *